United States Patent
Yi et al.

(10) Patent No.: US 8,766,231 B2
(45) Date of Patent: Jul. 1, 2014

(54) NANOSCALE ELECTRONIC DEVICE WITH BARRIER LAYERS

(75) Inventors: Wei Yi, Mountain View, CA (US); Jianhua Yang, Palo Alto, CA (US); Gilberto Medeiros Ribeiro, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 308 days.

(21) Appl. No.: 13/041,617

(22) Filed: Mar. 7, 2011

(65) Prior Publication Data

US 2012/0228575 A1 Sep. 13, 2012

(51) Int. Cl.
*H01L 45/00* (2006.01)
*H01L 21/62* (2006.01)

(52) U.S. Cl.
USPC .................................. 257/4; 257/5

(58) Field of Classification Search
USPC ................. 257/355, E29.237, 2–5, E45.002
See application file for complete search history.

(56) References Cited

U.S. PATENT DOCUMENTS

| | | | |
|---|---|---|---|
| 8,450,711 B2 * | 5/2013 | Williams et al. | 257/2 |
| 8,461,563 B2 * | 6/2013 | Yasuda | 257/2 |
| 8,487,294 B2 * | 7/2013 | Wen et al. | 257/4 |
| 2008/0079029 A1 * | 4/2008 | Williams | 257/213 |
| 2009/0027976 A1 | 1/2009 | Brewer et al. | |
| 2009/0272962 A1 | 11/2009 | Kumar et al. | |
| 2009/0290412 A1 | 11/2009 | Mouli | |
| 2009/0302296 A1 | 12/2009 | Fuchigami et al. | |
| 2010/0061142 A1 | 3/2010 | Arita et al. | |
| 2010/0078758 A1 | 4/2010 | Sekar et al. | |
| 2010/0148324 A1 | 6/2010 | Chen et al. | |

FOREIGN PATENT DOCUMENTS

WO WO2010085225 A1 * 7/2010

* cited by examiner

*Primary Examiner* — Cuong Q Nguyen

(57) ABSTRACT

On example of the present invention is a nanoscale electronic device comprising a first conductive electrode, a second conductive electrode, and a device layer. The device layer comprises a first dielectric material, between the first and second conductive electrodes, that includes an effective device layer, a first barrier layer near a first interface between the first conductive electrode and the device layer, and a second barrier layer near a second interface between the second conductive electrode and the device layer. A second example of the present invention is an integrated circuit that incorporates nanoscale electronic devices of the first example.

18 Claims, 13 Drawing Sheets

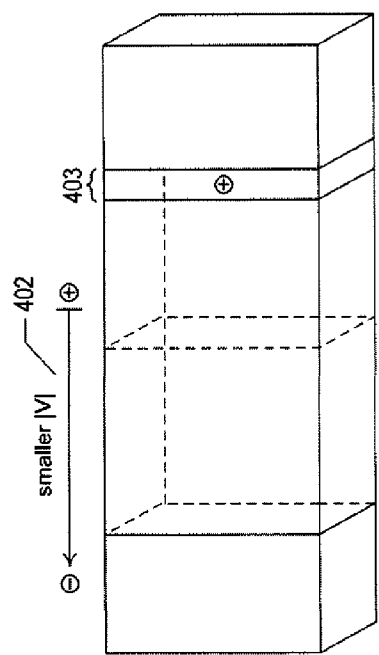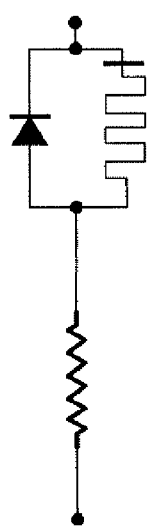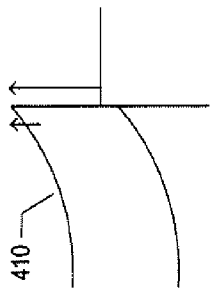

NANOSCALE ELECTRONIC DEVICE WITH BARRIER LAYERS

BACKGROUND

During the last ten years, significant efforts have been made to develop nanoscale electronic components, and new manufacturing methods for producing the nanoscale electronic components, to allow fabrication of integrated circuits that incorporate nanoscale electronic circuitry. These efforts are motivated by challenges that have arisen with respect to increasing the densities at which electronic components can be fabricated within integrated circuits using traditional photolithography-based integrated-circuit fabrication methods. These fabrication methods are constrained by the wavelength of light used to fix and etch photoresist layers and by decreases in reliability of small-scale components due to a variety of factors, including increasing manufacturing defects, increasing tunneling and stray current paths between small-scale components, and increases in resistances of small-scale signal lines and electronic components. Recent advances are directed to designing nanoscale electronic components that can be fabricated by nanoimprinting and other new technologies or that can self-aggregate to produce useful subcomponents, such as nanowire-crossbar arrays. As with any new field of technological development, researchers and developers continue to seek new types of nanoscale electronic devices for use in integrated circuits as well as new methods for fabricating such devices, controlling such devices, and employing such devices as components of integrated circuits.

BRIEF DESCRIPTION OF THE DRAWINGS

FIGS. 4A-C illustrate the nanoscale electronic device of FIGS. 2 and 3A when a potential is applied across the device in the forward direction.

DETAILED DESCRIPTION

FIGS. 1A-7C, discussed below, illustrate the operational characteristics of a general class of nanoscale electronic devices that can be used as memory elements in nanoscale memory arrays and in a variety of other subcomponents and subcircuits of integrated circuits. The term "nanoscale" refers to the fact that at least one dimension of these nanoscale electronic devices is less than 100 nm. As fabrication methods continue to advance, the term "nanoscale" may alternatively refer to components and devices with at least one dimension less than 50 nm, less than 20 nm, less than 10 nm, or less than five nm. In many cases, nanoscale electronic devices have two or all dimensions less than 50 nm, 20 nm, less than 10 nm, or less than five nm. In other cases, nanoscale electronic devices include a component with sub-microscale, microscale, or longer-length dimensions to facilitate interconnection of individual nanoscale electronic devices into subcomponents and subcircuits, such as two-dimensional and three-dimensional memory arrays. In FIGS. 1A-7C, the general class of nanoscale electronic devices is illustrated with omission of certain details of particular nanoscale-electronic-device implementations. Certain of these particular features are discussed with reference to subsequent figures, including FIG. 12, that illustrate examples of nanoscale electronic devices of the present invention.

Figure 1A:
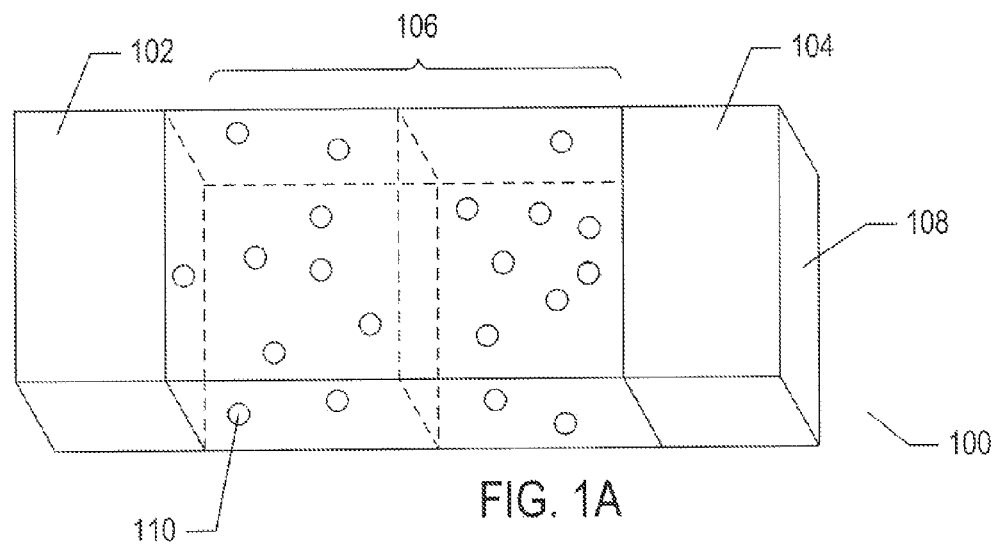
FIGS. 1A-C illustrate a generalized nanoscale electronic device prior to application of a state-changing voltage across the device.
Figure 1B:
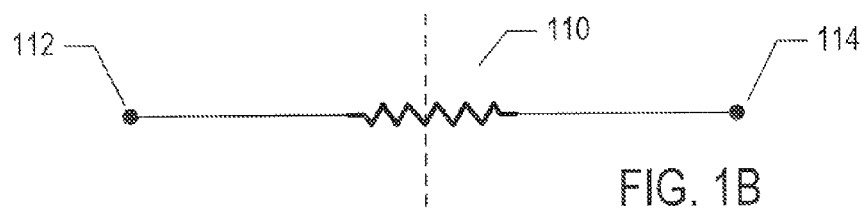
Figure 1C:
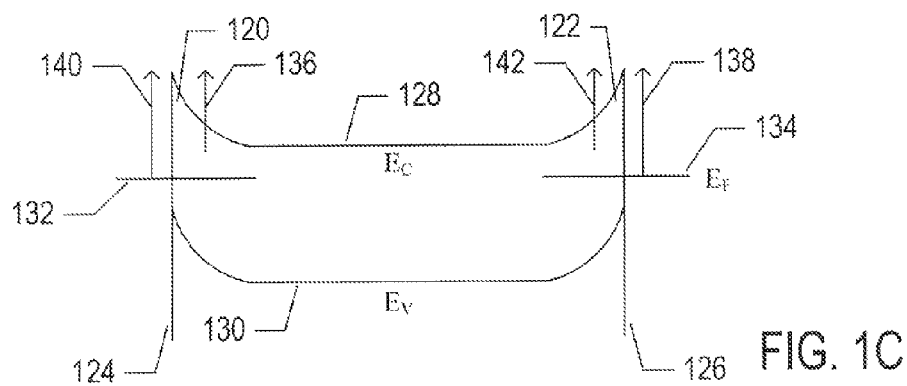

The nanoscale electronic devices discussed with reference to FIGS. 1A-7C have characteristics of memristors as well as characteristics of diodes. The memristor characteristics involve state changes in which the nanoscale electronic devices can be reversibly switched between two or more stable electronic states. FIGS. 1A-C illustrate a generalized nanoscale electronic device prior to application of a state-changing voltage across the device. FIGS. 1A-C employ illustration conventions that are used throughout FIGS. 1A-7C. The nanoscale electronic device 100 includes two conductive electrodes 102 and 104. Those portions of the conductive electrodes immediately adjacent to one or more intervening dielectric and/or semiconductor layers 106 are shown in FIG. 1A. The electrodes may extend in one or more directions, parallel to the end surface 108 of electrode 104, to provide interconnection with other nanoscale electronic devices and other circuit components and subcircuits. A dielectric and/or semiconductor layer, referred to below as the "device layer," 106, includes doping entities that generate electron or hole charge carriers, such as doping entity 110, shown as small spherical particles within the device layer. The doping entities may be vacancies, interstitials, dopants, ions, or other types of carrier or carrier-generating species that, under proper conditions, facilitate conductance of electric current through the device layer.

FIG. 1B shows a simple circuit diagram that represents the functionality of the nanoscale electronic device shown in FIG. 1A. Prior to application of sufficient voltages to, or electric fields across, the nanoscale electronic device 100, the nanoscale electronic device can be modeled as a simple resistor 110 interconnecting two points 112 and 114 within a circuit. The magnitude of the resistance may be a function of the particular dielectric and/or semiconductor material used in the device layer as well as the concentration and type of doping entities.

FIG. 1C illustrates an example of a simple band-diagram for the nanoscale electronic device shown in FIG. 1A. For purposes of the present discussion, the device layer is modeled as an n-type semiconductor that forms Schottky barriers at interfaces with noble-metal conductive electrodes that do not undergo redox reactions with chemical components of the device layer. In FIG. 1C, Schottky-type barriers 120 and 122 form at the interfaces 124 and 126 of the device layer and each of the two electrodes. The relative energy levels of the conduction band and valence band for the device layer are represented in FIG. 1C by curves 128 and 130, also labeled $E_C$ and $E_V$, respectively, and the relative energy level of the Fermi level $E_F$ is represented by horizontal line segments 132 and 134. At each Schottky-type barrier 120 and 122, a first vertical arrow 136 and 138 indicates the potential barrier to flow of electrons from the adjacent metal electrode into the device layer and a second vertical arrow 140 and 142 indicates the magnitude of the potential barrier to flow of conduction-band electrons from the device layer into the adjacent metal electrode.

Figure 2:
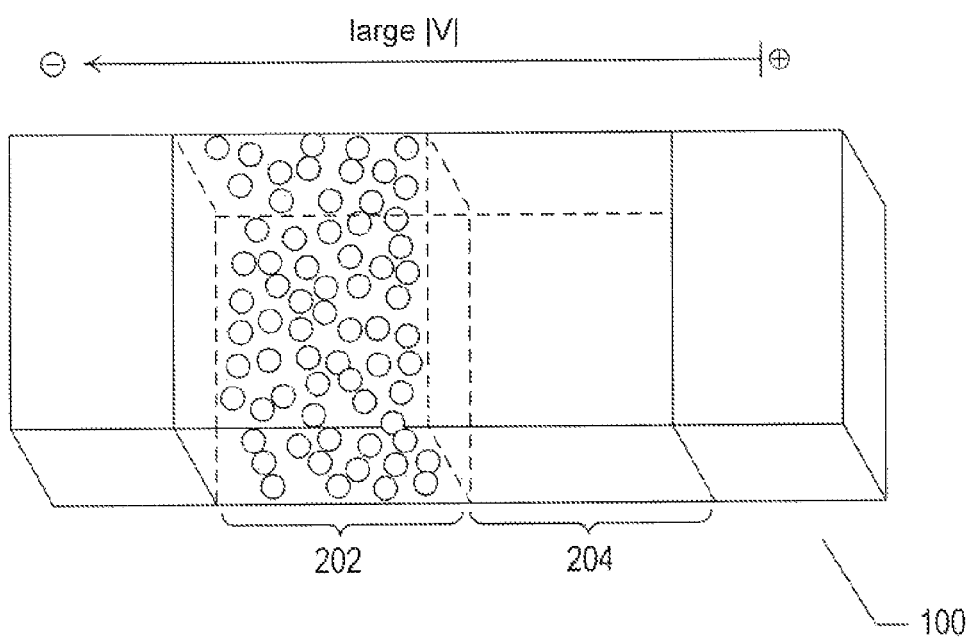
FIG. 2 illustrates application of a relatively large positive voltage across the nanoscale electronic device shown in FIG. 1A in a left-to-right direction.

FIG. 2 illustrates application of a relatively large positive voltage, or state-changing potential, across the nanoscale electronic device shown in FIG. 1A in a left-to-right direction. Because the device layer is considered, for purposes of the present discussion, as an n-type semiconductor, because the doping entities are modeled as behaving as positively-charged entities under applied electrical fields, and because the applied voltage is greater than a threshold voltage that induces dopant-entity migration within the device layer, the doping entities migrate leftward into the left-hand portion 202 of the device layer. The right-hand portion of the device layer 204 behaves as an n-type semiconductor with relatively higher resistance, while the left-hand portion 202 of the device layer behaves as a series resistor with relatively lower resistance. Because there is a threshold electric-field strength below which the doping entities have very low mobilities, the transformation, under an applied state-changing voltage, of the device layer into an n-type semiconductor portion 204 and a dielectric portion 202 is stable, over time. When the applied electric field is removed, and there is no electric field applied across the nanoscale electronic device with magnitude greater than or equal to the threshold field strength that induces mobility of the carriers, the mobilities of the doping entities fall to very low levels. The state of the nanoscale electronic device shown in FIG. 2 is referred to, below, as the "first state."

Figure 3A:
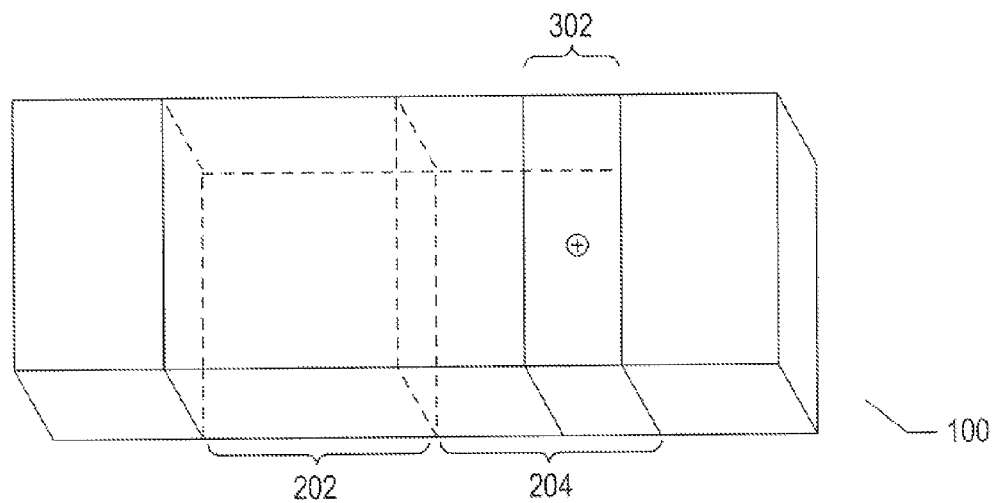
FIGS. 3A-C illustrate the electronic characteristics of the nanoscale electronic device in a first electronic state, following application of a state-changing voltage across the device, as shown in FIG. 2.
Figure 3B:
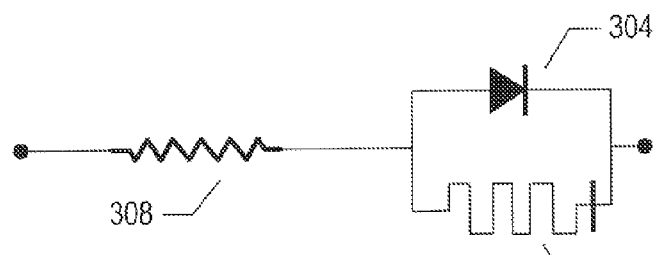
Figure 3C:
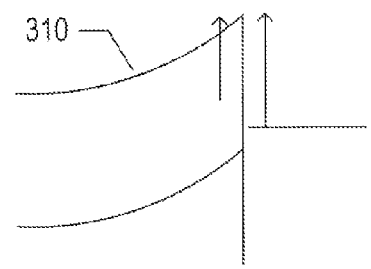

FIGS. 3A-C illustrate the electronic characteristics of the nanoscale electronic device in a first electronic state, following application of a state-changing voltage across the device, as shown in FIG. 2. As shown in FIG. 3A, the right-hand portion of the device layer 204, referred to as the "active layer," behaves as a Schottky diode while the left-hand portion of the device layer 202, referred to as the "inactive layer," is significantly doped and acts as a relatively low-resistance series resistor. A positive depletion layer 302 forms near the interface of the device layer and the right-hand electrode. Thus, the active layer of the device layer forms a classic Schottky-barrier diode at the interface of the active layer and the right-hand electrode. As shown in FIG. 3B, the nanoscale electronic device can be modeled as a diode 304 in parallel with a memristor 306, in the active layer 204, and the left-hand portion of the device layer 202, referred to as the "inactive layer," can be modeled as a resistor 308 in series with the parallel diode and memristor 304 and 306. The schematic energy band diagram for the Schottky-like interface between the active layer and electrode 310 is shown in FIG. 3C. While the potential barriers have the same magnitudes as shown in FIG. 1C, the slope of the device-layer conduction-band energy level 310 is shallower, due to the presence of the depletion region 302.

FIGS. 4A-C illustrate the nanoscale electronic device of FIGS. 2 and 3A when a potential is applied across the device in the forward direction. As shown in FIG. 4A, the applied potential 402 is of smaller magnitude than the state-changing potential applied in FIG. 2. This smaller-magnitude applied potential in the forward direction decreases the width of the depletion layer 403 and lowers the potential barrier 410 for current flow from the active layer to the right-hand electrode, as shown in FIG. 4C. Thus, under a moderate forward bias, a nanoscale electronic device behaves as a forward-biased diode. When the nanoscale electronic device is forward biased, the nanoscale electronic device is in a conductive state, and when the nanoscale electronic device is unbiased or reverse biased, the nanoscale electronic device is in a low-conductance state.

Figure 5:
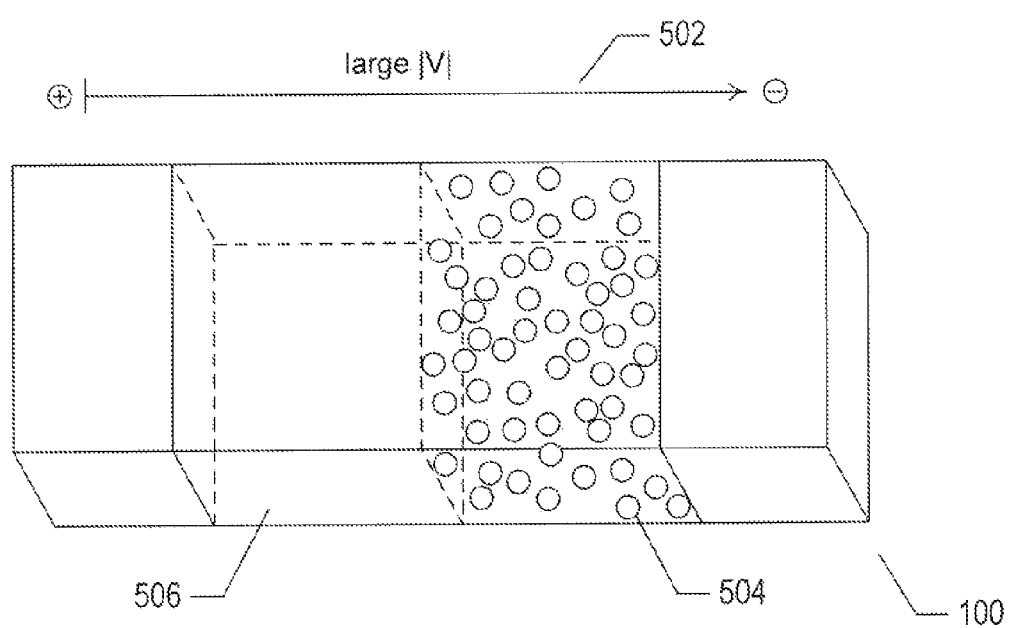
FIG. 5 illustrates application of a relatively large potential to the nanoscale electronic device shown in FIG. 2 in an opposite polarity to the applied potential of FIG. 2.

FIG. 5 illustrates application of a relatively large potential to the nanoscale electronic device shown in FIG. 2 in an opposite polarity to the applied potential of FIG. 2. This large-magnitude opposite-polarity potential 502 results in migration of the doping entities into the right-hand portion of the device layer of the nanoscale electronic device 504, rendering this portion 504 of the device layer inactive, with the left-hand portion of the device layer 506 becoming the active layer. The electronic state of the nanoscale electronic device shown in FIG. 5 is referred to as the "second state."

Figure 6A:
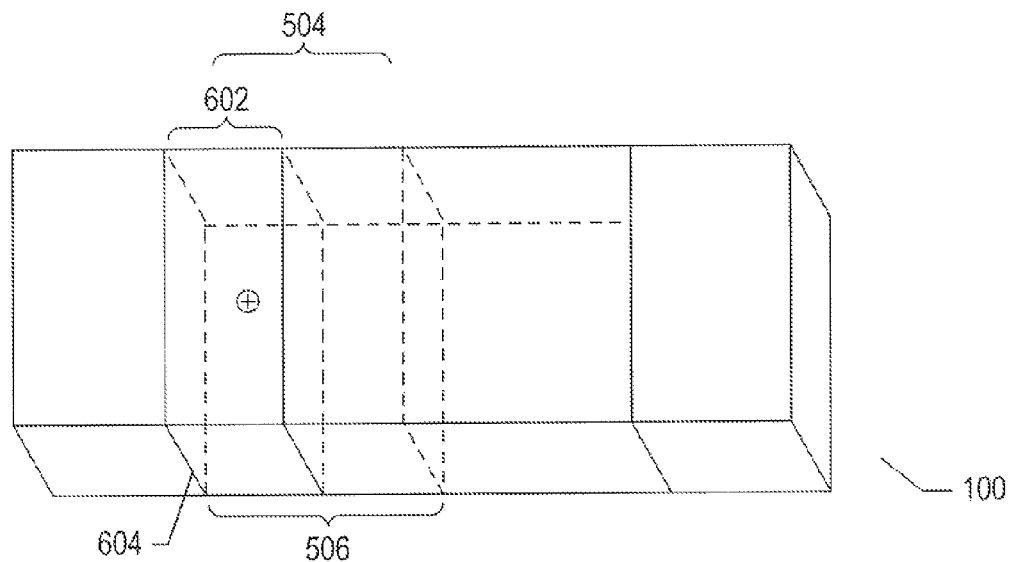
FIGS. 6A-C illustrate electronic characteristics of the nanoscale electronic device in the second state, following application of a state-changing voltage across the device, as shown in FIG. 5.
Figure 6B:
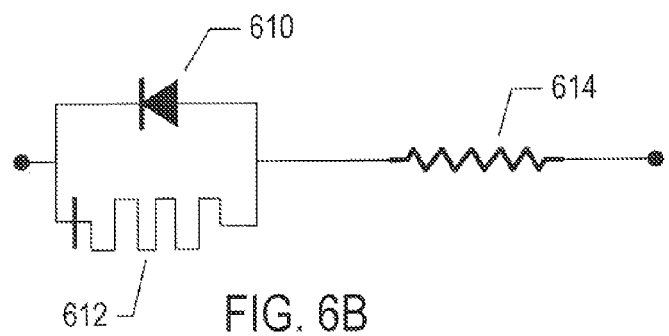
Figure 6C:
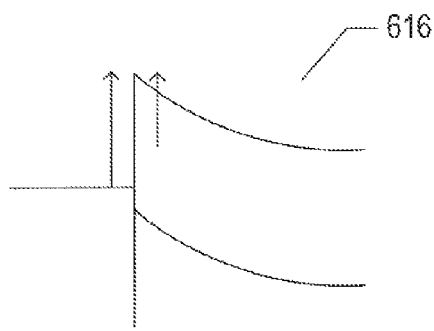

FIGS. 6A-C illustrate electronic characteristics of the nanoscale electronic device in the second state, following application of a state-changing voltage across the device, as shown in FIG. 5. As shown in FIGS. 6A-C, in the second state discussed with reference to FIG. 5, the nanoscale electronic device 100 is characterized by a broad depletion zone 602 at the interface between the active layer and the left-hand electrode 604, and the nanoscale electronic device can be modeled, as shown in FIG. 6B, as a diode 610 in parallel with a memristor 612 that are together in series with a resistor 614. As in FIGS. 3A-C, the nanoscale electronic device of FIGS. 6A-C has, at moderate applied electrical-field strengths, operational characteristics of a diode. A band-gap-like diagram 616 illustrating the Schottky barrier formed at the interface 604 between the new active layer 506 of the nanoscale electronic device and the left-hand electrode is shown in FIG. C.

Figure 7A:
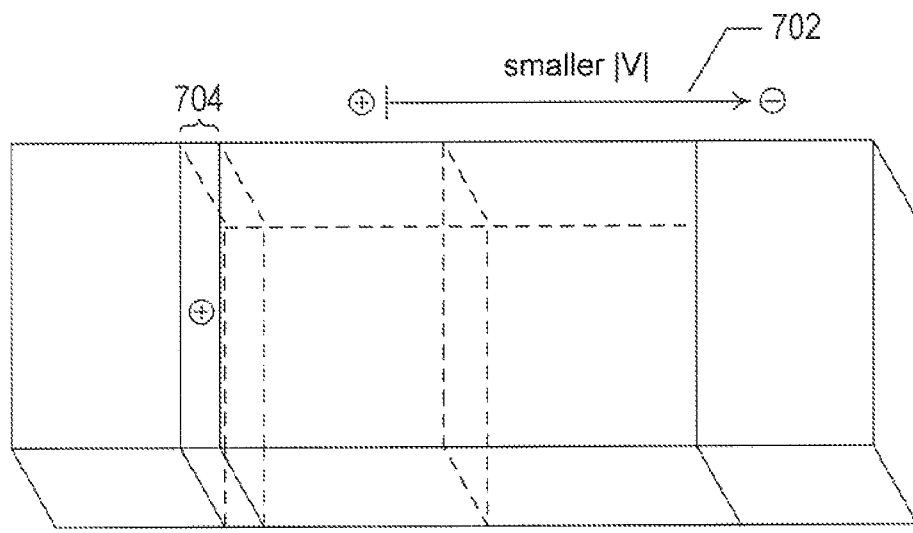
FIGS. 7A-C illustrate the nanoscale electronic device of FIGS. 5 and 6A-C when a moderate potential is applied across the device in the forward direction.
Figure 7B:
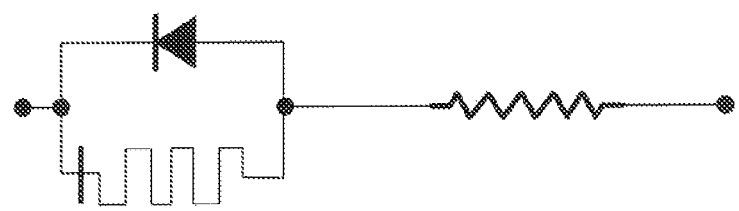
Figure 7C:
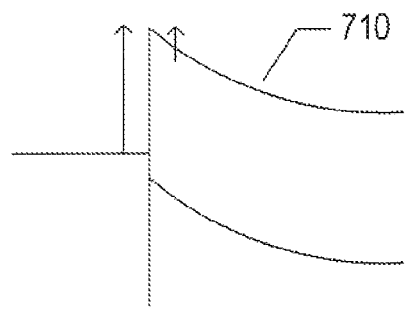

FIGS. 7A-C illustrate the nanoscale electronic device of FIGS. 5 and 6A-C when a moderate potential is applied across the device in the forward direction. FIGS. 7A-C, in the same fashion as FIGS. 4A-C, illustrate that, under moderate applied voltages 702, the depletion zone 704 of the nanoscale electronic device becomes narrower and the potential barrier 710 to current flow decreases, in magnitude, as in a classic Schottky-barrier diode. Thus, under a moderate forward bias, a nanoscale electronic device behaves as a forward-biased diode. When the nanoscale electronic device is forward biased, the nanoscale electronic device is in a conductive state, and when the nanoscale electronic device is unbiased or reverse biased, the nanoscale electronic device is in a low-conductance state. Thus, the nanoscale electronic device can be in either a first state, shown in FIGS. 2-4C, or a second state, shown in FIGS. 5-7C. These states correspond to polarities of the nanoscale electronic device. In either state, the nanoscale electronic device can be in a conductive state, when forward biased, and in a low-conductance state, when unbiased or reverse biased, with the direction of biasing determined by the overall state, or polarity, of the nanoscale electronic device.

Figure 8:
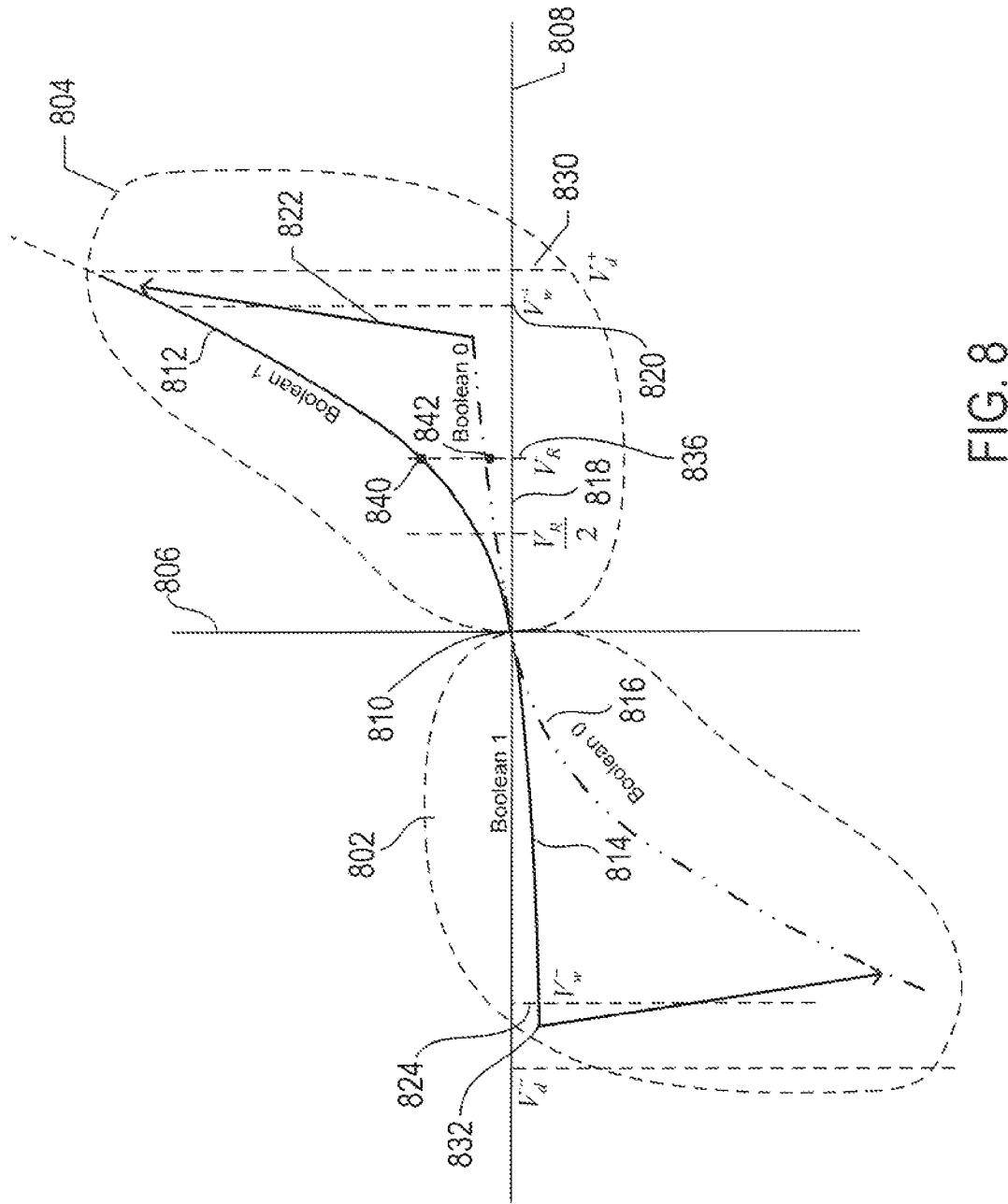
FIG. 8 illustrates operational characteristics of the nanoscale electronic device discussed above with reference to FIGS. 1A-7C.

FIG. 8 illustrates operational characteristics of the nanoscale electronic device discussed above with reference to FIGS. 1A-7C. The nanoscale electronic device is characterized by a closed current-voltage ("I-V") curve with two lobes 802 and 804, plotted with respect to a current axis 806 and voltage axis 808, that are roughly symmetrically related by an inversion center at the origin 810. The right-hand exponential curve 812 and left-hand relatively constant curve 814 together comprise a classic diode I-V curve for the first state of the nanoscale electronic device discussed above with reference to FIG. 2, in which the interface between the active layer and right-hand electrode is a classic Schottky-barrier diode. The left-hand exponential curve 816 and right-hand constant curve 818 together form a classic diode I-V curve for the second state of the nanoscale electronic device discussed above with reference to FIG. 5, in which a classic Schottky-barrier diode forms at the interface between the active layer and the left-hand electrode. When a positive voltage of significant magnitude, $V_w^+$ 820, is applied across the nanoscale electronic device, the nanoscale electronic device acts a memristor and transitions, along the highly-sloped portion 822 of the I-V curve from a low conductivity state corresponding to a reverse-biased diode in the second state shown in FIG. 5, to a forward-biased-diode in the first state shown in FIG. 2. Similarly, when a negative voltage of sufficient magnitude is applied across the nanoscale electronic device, $V_w^-$ 824, the nanoscale electronic device transitions, as a memristive device, from the second state discussed with reference to FIG. 5 and represented by curve portions 816 and 818 in FIG. 8 to the first state discussed with reference to FIG. 2 and represented by curve portions 812 and 814 in FIG. 8. When the magnitude of the applied voltage exceeds a maximum positive voltage $V_D^+$ 830 or $V_D^-$ 832, the device may destruct due to resistive heating, dielectric breakdown of the active region, electromigration of metallic electrodes, and other destructive phenomena. The applied voltages that result in memristor-like state transitions, $V_w^+$ and $V_w^-$, correspond to WRITE-1 and WRITE-0 operations, respectively. At a lower applied positive voltage $V_R$ 836, two different conductivity states 840 and 842 can be differentiated by the current flow through the nanoscale electronic device. When a relatively large current flows during application of the voltage $V_R$, represented by point 840 in FIG. 8, the device stores Boolean value "1" and when relatively little current flows through the device upon application of voltage $V_R$, represented by point 842 in FIG. 8, the device stores Boolean value "0."

Figure 9A:
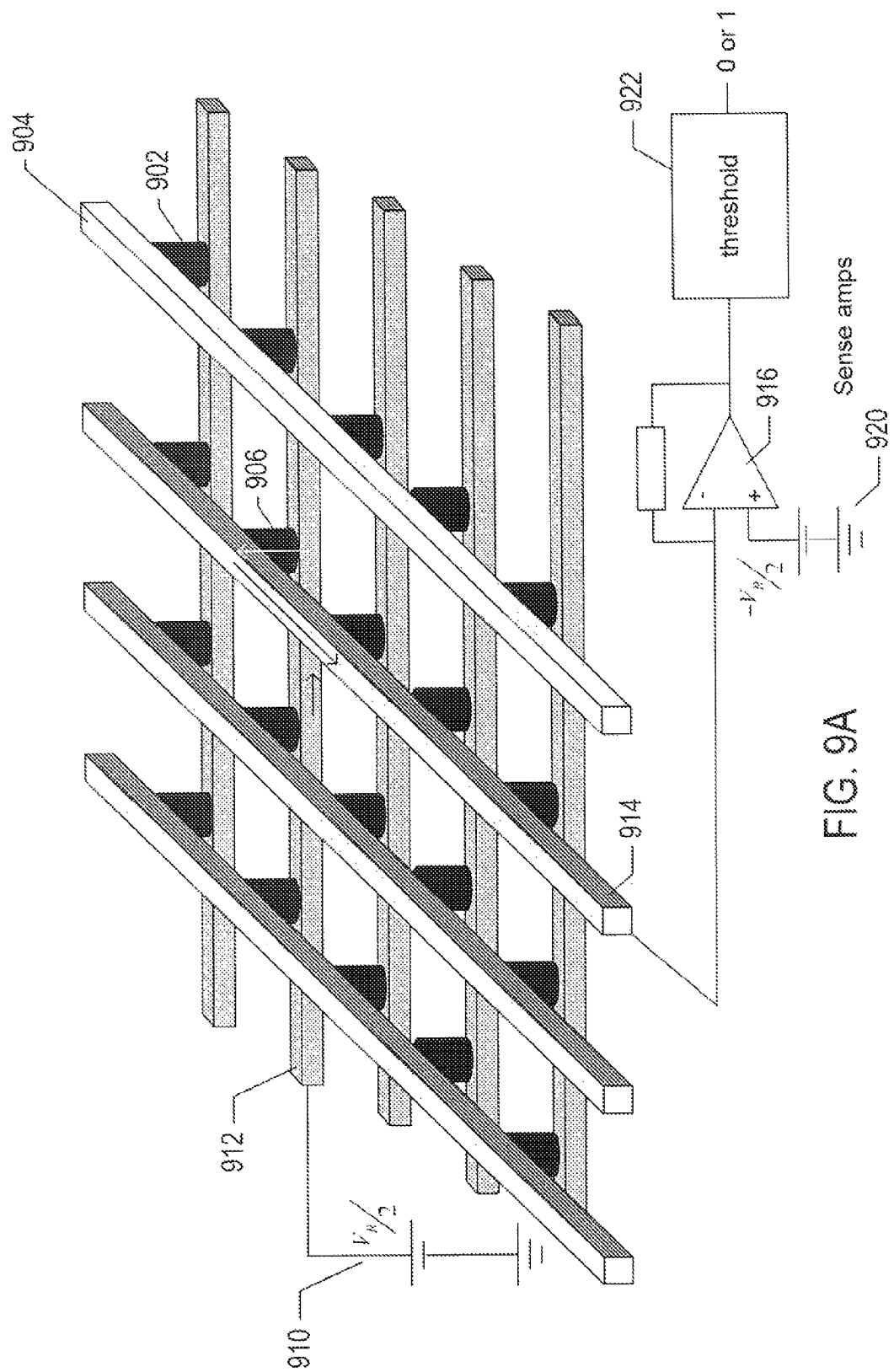
FIGS. 9A-B illustrates an example application of a nanoscale electronic device.
Figure 9B:
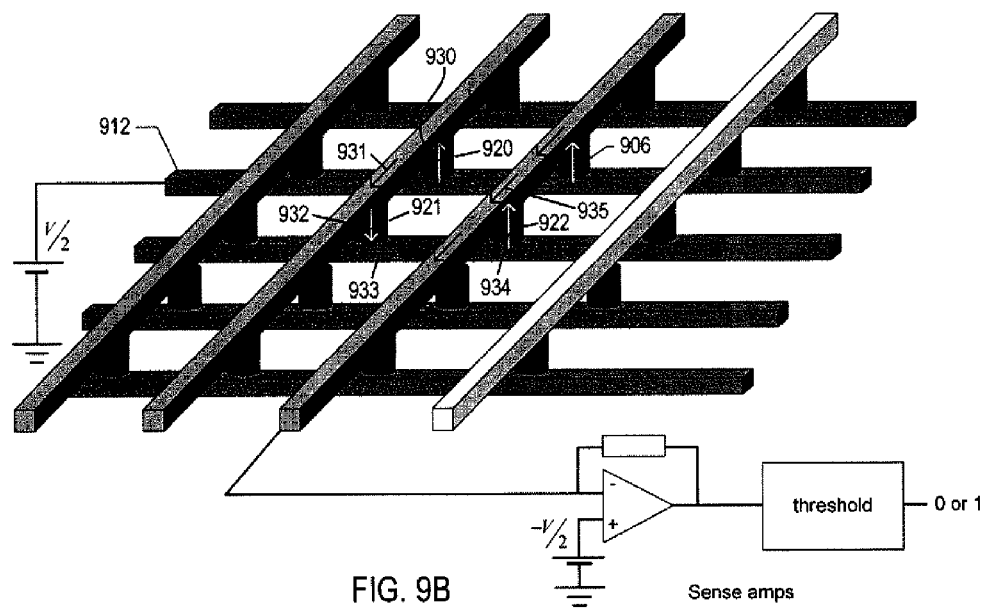

FIGS. 9A-B illustrates an example application of a nanoscale electronic device. In FIG. 9A, 20 nanoscale electronic devices are arrayed within a nanowire crossbar. In FIG. 9A, the short, cylindrical, vertically oriented segments, such as segment 902, represent nanoscale electronic devices such as the nanoscale electronic device discussed above with reference to FIGS. 1A-8, and the long bar-like objects, such as bar-like object 904, represent nanowires. In certain nanowire-crossbar implementations, nanowires are coated with, or formed from, particular dielectric and/or semiconductive materials and are arranged into two sets of parallel nanowires, with the nanowires of one set of nanowires roughly orthogonal to the nanowires of the second set of nanowires, to form the nanowire-crossbar array. Points of contact between nanowires of the first set of nanowires and nanowires of the second set of nanowires form nanoscale electronic devices such as that discussed above with reference to FIGS. 1A-8.

As shown in FIG. 9A, the state of nanoscale electronic device 906 can be determined by applying a positive voltage $$\frac{V_R}{2}$$

910 to a lower nanowire 912 and interconnecting an upper nanowire 914 to an op amp 916 maintained at $$\frac{V_R}{2}$$

above ground 920. A threshold component 922 emits a "1" signal, when the current emitted by the op amp exceeds a threshold value, and otherwise emits a "0" signal. Provided that the nanoscale electronic device 906 is in a conductive state of the appropriate polarity at the applied voltage of $V_R$, nanoscale electronic device 906 contributes to an additional voltage drop of $$\frac{V_R}{2}$$

applied to the op amp through nanowire 912 and nanoscale electronic device 906, resulting in a voltage drop across the op-amp inputs of nearly $V_R$. When the nanoscale electronic device 906 is in a low-conductance state, the voltage $$\frac{V_R}{2}$$

applied to nanowire 912 is dissipated across the nanoscale electronic device 906, so that the voltage drop across the op-amp inputs is near $$\frac{V_R}{2}.$$

However, returning to FIG. 8, it can be seen that when voltage $$\frac{V_R}{2}$$

850 is applied to nanowire 912, significant current flows through the nanoscale electronic device, as represented by point 852, when the nanoscale electronic device is in the conductive state. As a result, as shown in FIG. 9B, when nanoscale electronic devices 920-922 are in conductive states, then the potential $$\frac{V_R}{2}$$

falls across nanoscale electronic device 906 as well as across nanoscale electronic devices 920-922 and significant current flows through these devices as well as through nanoscale electronic device 906, when nanoscale electronic device 906 is in a conductive state. When, for example, nanoscale electronic device 906 is in a low-conductance state, then alternative conductive paths through nanoscale electronic devices 920-922 and other conductive nanoscale devices within the crossbar array may result in application of a sufficient voltage differential across the op amp inputs to generate an output signal to the threshold component that results in the threshold component emitting a "1" signal, despite the fact that nanoscale electronic device 906 is in a low-conductance state. The alternative conductive paths can therefore make conductivity-state determinations of particular nanoscale electronic devices by the method shown in FIG. 9A unreliable.

Figure 10:
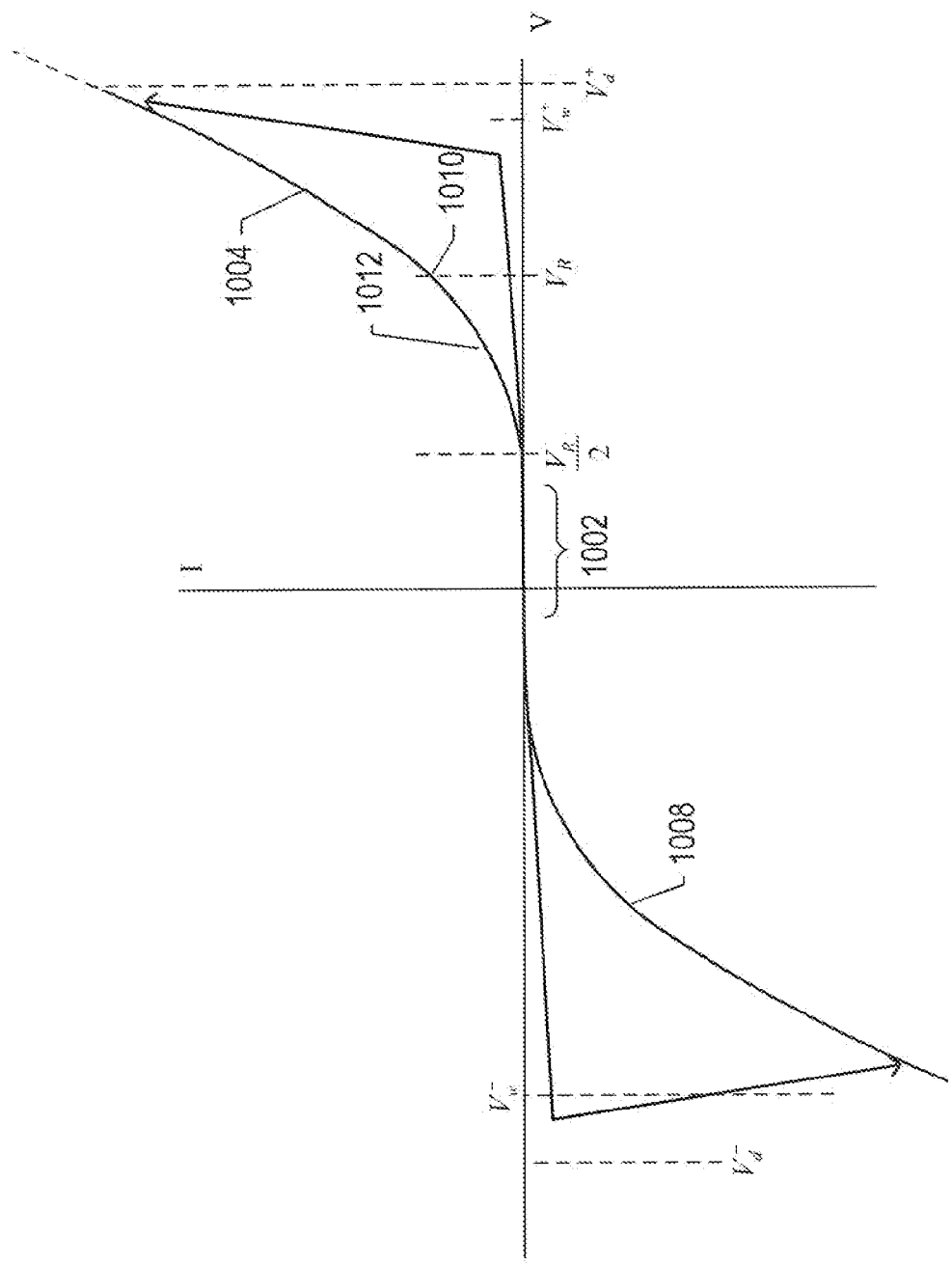
FIG. 10 illustrates, using the same illustration conventions as used in FIG. 8, desired operational characteristics of a nanoscale electronic device that inhibits or prevents the unwanted current paths discussed above with reference to FIG. 9B and that represents an example of the present invention.

To prevent undesired current paths within a crossbar array, and other undesired current paths that lower the reliability of subcircuits that incorporate nanoscale electronic devices, the nanoscale electronic devices should have somewhat different operational characteristics than those discussed above with reference to FIG. 8. FIG. 10 illustrates, using the same illustration conventions as used in FIG. 8, desired operational characteristics of a nanoscale electronic device that inhibits or prevents the unwanted current paths discussed above with reference to FIG. 9B and that represents an example of the present invention. In FIG. 10, a relatively constant, or horizontal, portion 1002 has been introduced into the exponential curve portions 1004 and 1008 of the I-V curve for a nanoscale electronic device. In other words, while the slope of the I-V curve remains non-0 as the exponential portions of the I-V curve pass through the origin, in FIG. 8, the slope of the exponential portions of the I-V curve in FIG. 10 is 0 or nearly 0 at the inflection point. As a result, the nanoscale electronic device with operational characteristics illustrated in FIG. 10 passes significant current at the READ voltage $V_R$, as represented by point 1010, but passes very little current at the applied voltage $$\frac{V_R}{2},$$

represented in FIG. 10 by point 1012. When nanoscale electronic devices with operational characteristics shown in FIG. 10 are employed in the example application of FIGS. 9A-B, the conductivities of nanoscale electronic devices 920-922 at the $$\frac{V_R}{2}$$

applied voltage would be nearly 0, and the alternative potential conductive path represented by arrows 930-935 would resist the voltage applied to nanowire 912. Thus, by creating a nanoscale electronic device in which the exponential portion of the I-V curve has zero or small slope at the inflection point, as shown in FIG. 10, and both negative and positive threshold conductance voltages at which conductivity begins to exponentially rise with applied voltages of increasing magnitude, a nanoscale electronic device exhibits significant conductivity at the READ voltage $V_R$ but little or no conductivity at the applied voltage $$\frac{V_R}{2}.$$

Figure 11A:
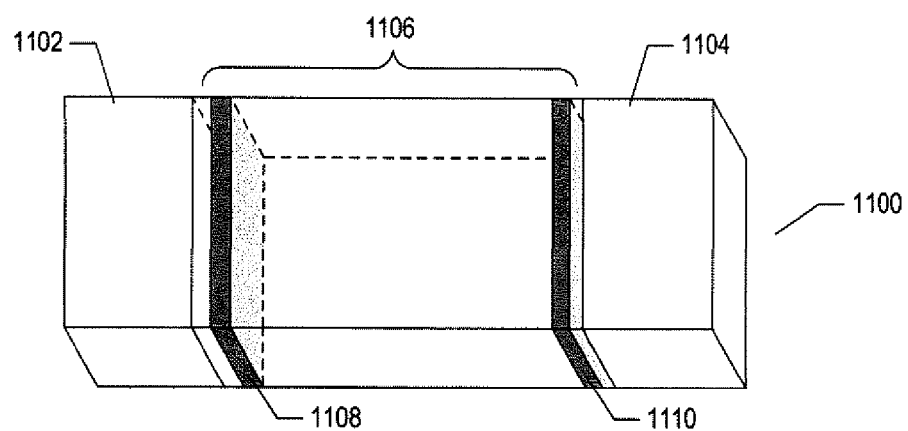
FIGS. 11A-B illustrate an example nanoscale electronic device of the present invention with the operational characteristics illustrated in FIG. 10.
Figure 11B:
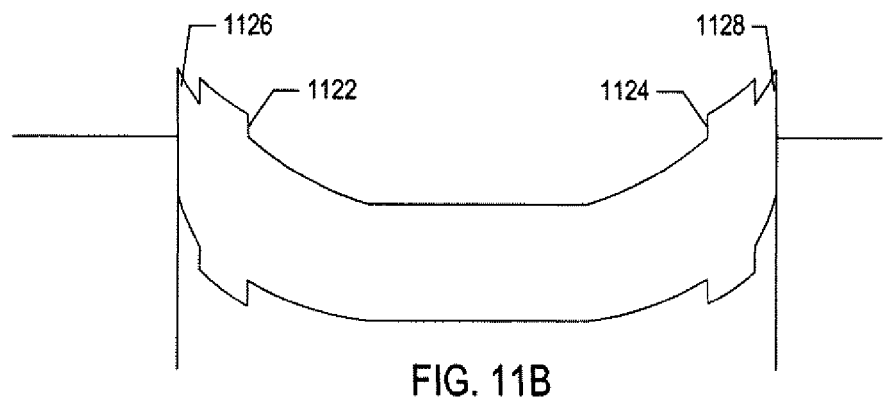

FIGS. 11A-B illustrate an example nanoscale electronic device of the present invention with the operational characteristics illustrated in FIG. 10. The nanoscale electronic device 1100 shown in FIG. 11A includes two conductive electrodes 1102 and 1104 and a device layer 1106 comprising a dielectric and/or semiconductor material with doping entities, as in the nanoscale electronic device shown in FIG. 1A. In addition, two barrier layers 1108 and 1110 have been introduced into the device layer, near the interfaces between the device layer and the conductive electrodes. Each barrier layer includes a dielectric and/or semiconductor material with a larger band gap than the dielectric and/or semiconductor material of the device layer. As shown in the band gap diagram 1120 of FIG. 11B, the higher-hand gap material of the barrier layers, introduce new potential barriers 1122 and 1124 in addition to the Schottky-barrier potential barriers 1126 and 1128. These additional potential barriers introduced by the barrier layers 1108 and 1110 result in non-0 threshold voltages at which conductivity begins to increase exponentially with applied voltages with increasing magnitudes, at both device-layer/electrode interfaces, that extends the voltage at which conductance begins to exponentially rise past the voltage $$\frac{V_R}{2}.$$

Thus, an overall I-V curve such as that shown in FIG. 10 is produced.

Figure 12:
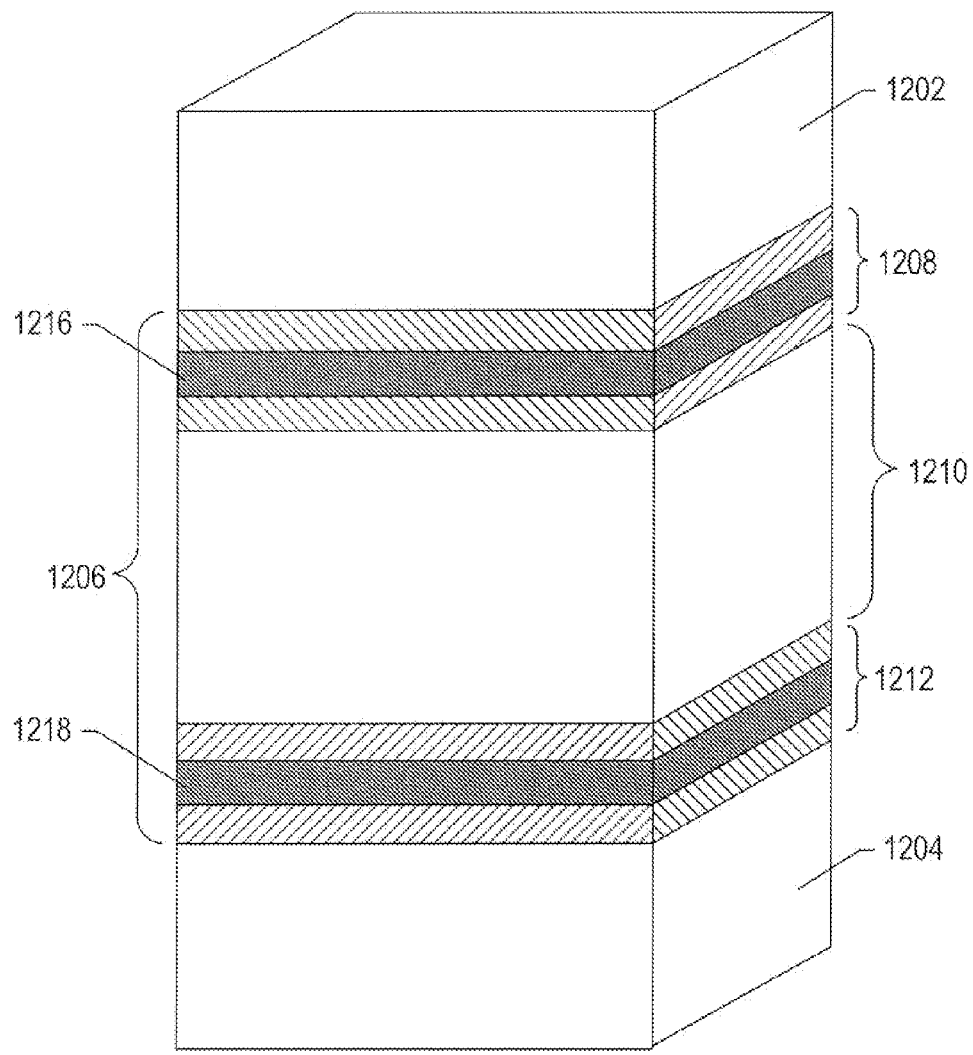
FIG. 12 illustrates a family of examples of the present invention.

FIG. 12 illustrates a family of examples of the present invention. The family of examples of the present invention comprises nanoscale electronic devices with a top conductive electrode 1202, a bottom conductive electrode 1204, and a device layer 1206 between the top electrode and bottom electrode. The device layer 1206 is further partitioned into a first barrier layer 1208, an effective device layer 1210, and a second barrier layer 1212. Each of the barrier layers includes a large-band-gap-material layer 1216 and 1218 embedded within a dielectric material that comprises each of the barrier layers 1208 and 1212. In one particular embodiment of the present invention, the two barrier layers 1208 and 1212 are insulating oxide, such as $TiO_2$, and the high-band gap material 1216 and 1218 is a different insulating oxide with a higher band gap than that of the effective device layer 1210. In this example of the present invention, effective device layer 1210 comprises a conductive oxide, such as $Ti_4O_7$. In an alternative example of the present invention, the barrier layers comprise a conductive oxide, such as $Ti_4O_7$ and the effective device layer 1210 comprises an insulating oxide, such as $TiO_2$. In this example, the higher-band gap materials 1216 and 1218 are insulating oxides with higher band gaps than the effective device layer material 1210.

Although the present invention has been described in terms of particular embodiments, it is not intended that the invention be limited to these embodiments. Modifications will be apparent to those skilled in the art. For example, nanoscale electronic devices that represent examples of the present invention may be fully symmetrical, with identical barrier layers at the interfaces between the device layer and electrical conductors or may be unsymmetrical, with different barrier layers used to interface between the device layer and conductive layers. Many of a wide variety of different dialect and/or semiconductor materials can be employed within nanoscale electronic devices that represent examples of the present invention as long as the operational characteristics of the nanoscale device are similar to those described above, with reference to FIG. 10, where the nanoscale electronic device is relatively conductive at the applied read voltage $V_R$ but relatively non-conductive at the applied read voltage $$\frac{V_R}{2}.$$

In certain examples of the present invention, additional material layers may be present in the device layer.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A nanoscale electronic device comprising:
a first conductive electrode;
a second conductive electrode; and
a device layer, comprising a first dielectric material, between the first and second conductive electrodes that includes:
an effective device layer between a first barrier layer and a second barrier layer,
the first barrier layer near a first interface between the first conductive electrode and the device layer, and
the second barrier layer near a second interface between the second conductive electrode and the device layer
where each of the first barrier layer and said second barrier layer further comprise a large-band-gap-material layer embedded within a dielectric material, the large-band-gap-material having a band gap that is greater than a band gap of the effective device layer.

2. The nanoscale electronic device of claim 1 wherein the first conductive electrode comprises one of;
a metallic material; and
a semiconductor material.

3. The nanoscale electronic device of claim 1 wherein the second conductive electrode comprises one of:
a metallic material; and
a semiconductor material.

4. The nanoscale electronic device of claim 1 wherein the effective device layer includes dopant entities and exhibits a first band gap between the highest-energy within the valence band and the lowest-energy within the conductive-band of the first dielectric material.

5. The nanoscale electronic device of claim 4 wherein the first barrier layer includes a first barrier-dielectric-material layer with a second band gap greater in magnitude than the first band gap and wherein the second barrier layer includes a second barrier-dielectric-material layer with a third band gap greater in magnitude than the first band gap.

6. The nanoscale electronic device of claim 4 wherein the first barrier layer comprises a second dielectric material, different from the first dielectric material, with conductance characteristics that differ from the conductance characteristics of the first dielectric material.

7. The nanoscale electronic device of claim 4 wherein the second barrier layer comprises a third dielectric material, different from the first dielectric material, with conductance characteristics that differ from the conductance characteristics of the first dielectric material.

8. The nanoscale electronic device of claim 1
wherein the effective device layer comprises $Ti_4O_7$;
wherein the first barrier layer comprises $TiO_2$; and
wherein the second barrier layer comprises $TiO_2$.

9. The nanoscale electronic device of claim 1
wherein the effective device layer comprises $TiO_2$;
wherein the first barrier layer comprises $Ti_4O_7$; and
wherein the second barrier layer comprises $Ti_4O_7$.

10. The nanoscale electronic device of claim 1
wherein the device layer exhibits memristive characteristics, according to which, when a voltage $Vw+$ is applied across the nanoscale electronic device, the nanoscale electronic device has a first electronic state in which the first interface exhibits characteristics of a Schottky-barrier diode with a first polarity and, when a voltage $Vw-$ of polarity opposite to $Vw+$ is applied across the nanoscale electronic device, the nanoscale electronic device has a second electronic state in which second interface exhibits characteristics of a Schottky-barrier diode with a second polarity.

11. The nanoscale electronic device of claim 10 wherein the first barrier layer produces a first threshold voltage, greater than 0V, at which conductivity of the first interface begins to increase exponentially above a small, constant saturation current.

12. The nanoscale electronic device of claim 11 wherein VR is an applied voltage at which the electronic state of the nanoscale electronic device is determined and wherein the first threshold voltage is greater than or equal to a voltage $VR/2$.

13. The nanoscale electronic device of claim 10 wherein the second barrier layer produces a second threshold voltage, less than 0V, at which conductivity of the second interface begins to increase exponentially above a small, constant saturation current.

14. The nanoscale electronic device of claim 11 wherein $-VR$ is an applied voltage at which the electronic state of the nanoscale electronic device is determined and wherein the second threshold voltage is less than or equal to a voltage $-VR/2$.

15. An integrated circuit that includes a plurality of nanoscale electronic devices, each nanoscale electronic device comprising:
a first conductive electrode;
a second conductive electrode; and
a device layer, comprising a first dielectric material, between the first and second conductive electrodes that includes an effective device layer between a first barrier layer and a second barrier layer,
the first barrier layer near a first interface between the first conductive electrode and the device layer, and
the second barrier layer near a second interface between the second conductive electrode and the device layer
where each of the first barrier layer and said second barrier layer further comprise a large-band-gap-material layer embedded within a dielectric material, the large-band-gap-material having a band gap that is greater than a band gap of the effective device layer.

16. The integrated circuit of claim 15 wherein the device layer exhibits memristive characteristics, according to which, when a voltage $Vw+$ is applied across the nanoscale electronic device, the nanoscale electronic device has a first electronic state in which the first interface exhibits characteristics of a Schottky-barrier diode with a first polarity and, when a voltage Vw− of polarity opposite to Vw+ is applied across the nanoscale electronic device, the nanoscale electronic device has a second electronic state in which second interface exhibits characteristics of a Schottky-barrier diode with a second polarity.

17. The nanoscale electronic device of claim 10 wherein the first barrier layer produces a first threshold voltage, greater than VR/2, or one half the voltage VR at which the electronic state of the nanoscale electronic device is determined.

18. The nanoscale electronic device of claim 10 wherein the second barrier layer produces a second threshold voltage, less than −VR/2, or one half the magnitude of opposite-polarity voltage -VR at which the electronic state of the nanoscale electronic device is determined.

\* \* \* \* \*

UNITED STATES PATENT AND TRADEMARK OFFICE
CERTIFICATE OF CORRECTION

PATENT NO. : 8,766,231 B2  
APPLICATION NO. : 13/041617  
DATED : July 1, 2014  
INVENTOR(S) : Wei Yi et al.

Page 1 of 2

It is certified that error appears in the above-identified patent and that said Letters Patent is hereby corrected as shown below:

In the Claims,

In column 9, line 45, in Claim 2, delete "of;" and insert -- of: --, therefor.

In column 10, line 7, in Claim 8, delete "Ti4O7;" and insert -- $Ti_4O_7$; --, therefor.

In column 10, line 8, in Claim 8, delete "TiO2;" and insert -- $TiO_2$; --, therefor.

In column 10, line 9, in Claim 8, delete "TiO2." and insert -- $TiO_2$. --, therefor.

In column 10, line 11, in Claim 9, delete "TiO2;" and insert -- $TiO_2$; --, therefor.

In column 10, line 12, in Claim 9, delete "Ti4O7;" and insert -- $Ti_4O_7$; --, therefor.

In column 10, line 13, in Claim 9, delete "Ti4O7." and insert -- $Ti_4O_7$. --, therefor.

In column 10, line 16, in Claim 10, delete "Vw+is" and insert -- $V_w^+$ is --, therefor.

In column 10, line 20, in Claim 10, delete "Vw-of" and insert -- $V_w^-$ of --, therefor.

In column 10, line 21, in Claim 10, delete "Vw+is" and insert -- $V_w^+$ is --, therefor.

In column 10, line 28, in Claim 11, delete "OV," and insert -- 0V, --, therefor.

In column 10, line 32, in Claim 12, delete "VR" and insert -- $V_R$ --, therefor.

In column 10, line 35, in Claim 12, delete "VR/2." and insert -- $V_R/2$. --, therefor.

In column 10, line 38, in Claim 13, delete "OV," and insert -- 0V, --, therefor.

In column 10, lines 41-42, in Claim 14, delete "wherein-VR" and insert -- wherein -$V_R$ --, therefor.

In column 10, line 45, in Claim 14, delete "-VR/2." and insert -- -$V_R/2$. --, therefor.

Signed and Sealed this  
Twenty-fifth Day of November, 2014

Michelle K. Lee  
*Deputy Director of the United States Patent and Trademark Office*

CERTIFICATE OF CORRECTION (continued)
U.S. Pat. No. 8,766,231 B2

In column 10, line 67, in Claim 16, delete "Vw+is" and insert -- $V_w^+$ is --, therefor.

In column 11, line 4, in Claim 16, delete "Vw-of" and insert -- $V_w^-$ of --, therefor.

In column 11, line 4, in Claim 16, delete "Vw+is" and insert -- $V_w^+$ is --, therefor.

In column 11, line 11, in Claim 17, delete "VR/2," and insert -- $V_R/2$, --, therefor.

In column 11, line 11, in Claim 17, delete "VR" and insert -- $V_R$ --, therefor.

In column 11, line 16, in Claim 18, delete "-VR/2," and insert -- $-V_R/2$, --, therefor.

In column 11, line 17, in Claim 18, delete "-VR" and insert -- $-V_R$ --, therefor.